US012761255B2

(12) United States Patent
Ricart et al.

(10) Patent No.: US 12,761,255 B2
(45) Date of Patent: Oct. 13, 2026

(54) ELECTRICAL ASSEMBLY

(71) Applicant: Lear Corporation, Southfield, MI (US)

(72) Inventors: Raúl Ricart, Valls (ES); Antoni Ferré Fàbregas, Valls (ES)

(73) Assignee: Lear Corporation, Southfield, MI (US)

( * ) Notice: Subject to any disclaimer, the term of this patent is extended or adjusted under 35 U.S.C. 154(b) by 151 days.

(21) Appl. No.: 18/673,452

(22) Filed: May 24, 2024

(65) Prior Publication Data

US 2024/0402229 A1 Dec. 5, 2024

Related U.S. Application Data

(60) Provisional application No. 63/504,765, filed on May 29, 2023.

(51) Int. Cl.
*G01R 27/02* (2006.01)
*B60R 16/027* (2006.01)

(52) U.S. Cl.
CPC ............ *G01R 27/02* (2013.01); *B60R 16/027* (2013.01)

(58) Field of Classification Search
None
See application file for complete search history.

(56) References Cited

U.S. PATENT DOCUMENTS

| | | | |
|---|---|---|---|
| 6,400,259 B1 | 6/2002 | Bourcart | |
| 7,560,827 B2 | 7/2009 | Jacas-Miret | |
| 7,633,301 B2 | 12/2009 | Steenwyk | |
| 10,011,192 B2 | 7/2018 | Bonk | |
| 10,189,379 B2 | 1/2019 | Bonk et al. | |
| 10,479,228 B2 | 11/2019 | Esslinger | |
| 10,882,420 B2 | 1/2021 | Ricart et al. | |
| 11,299,075 B2 * | 4/2022 | Jones | H02B 1/20 |
| 11,323,114 B2 | 5/2022 | Ricart | |
| 11,613,220 B2 * | 3/2023 | Ricart | B60N 2/072 701/45 |
| 11,634,101 B2 | 4/2023 | Ricart | |
| 2005/0150705 A1 | 7/2005 | Philippe | |
| 2008/0100980 A1 | 5/2008 | Jacas-Miret | |
| 2008/0157940 A1 | 7/2008 | Breed | |
| 2021/0086667 A1 | 3/2021 | Ferré Fàbregas | |
| 2021/0105011 A1 * | 4/2021 | Ricart | B60N 2/0264 |
| 2022/0126771 A1 * | 4/2022 | Jones | B60R 16/027 |
| 2025/0194036 A1 * | 6/2025 | Ricart | B60N 2/01558 |

FOREIGN PATENT DOCUMENTS

| | | | |
|---|---|---|---|
| CN | 119050701 A * | 11/2024 | H01R 25/145 |
| CN | 120096478 A * | 6/2025 | B60R 21/01 |

* cited by examiner

*Primary Examiner* — Jermele M Hollington

(74) *Attorney, Agent, or Firm* — McGarry Bair PC

(57) ABSTRACT

An electrical assembly comprises a track assembly; a conductor connected to the track assembly; an additional conductor connected to the track assembly; an identifier including a first terminal electrically connected to the conductor and a second terminal electrically connected to the additional conductor; and a component movably coupled with the track assembly, the component including a sensor configured to sense an electrical characteristic of the identifier.

20 Claims, 16 Drawing Sheets

ELECTRICAL ASSEMBLY

CROSS-REFERENCE TO RELATED APPLICATIONS

This application claims the benefit of and priority to U.S. Provisional Application 63/504,765 filed May 29, 2023, the disclosure of which is hereby incorporated by reference in its entirety as though fully set forth herein.

TECHNICAL FIELD

The present disclosure generally relates to electrical assemblies, including electrical assemblies that include track assemblies and/or that may, for example, be used in connection with vehicles.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and embodiments are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
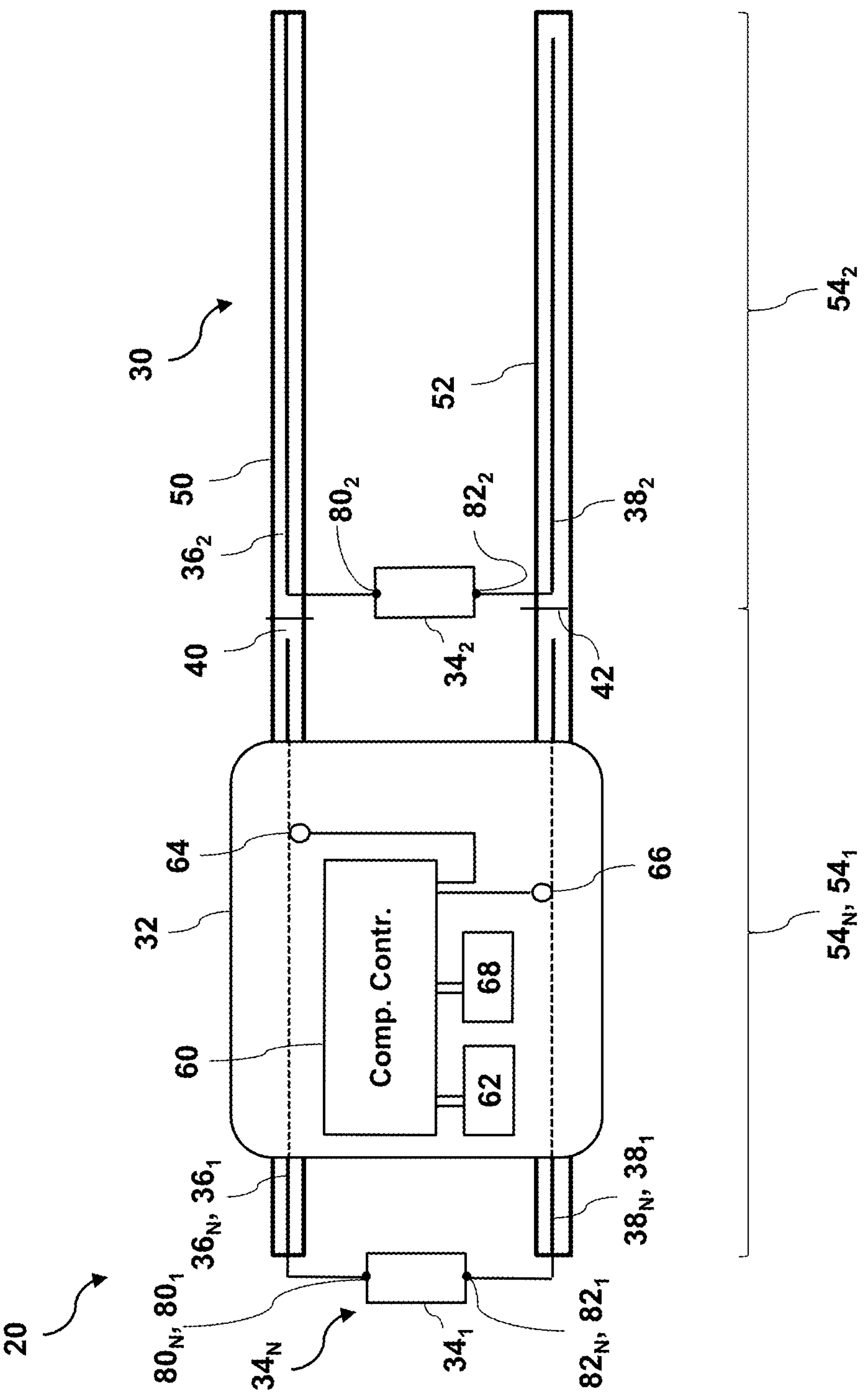
FIGS. 1-3 are schematic views generally illustrating embodiments of an electrical assembly according to teachings of the present disclosure.
Figure 2:
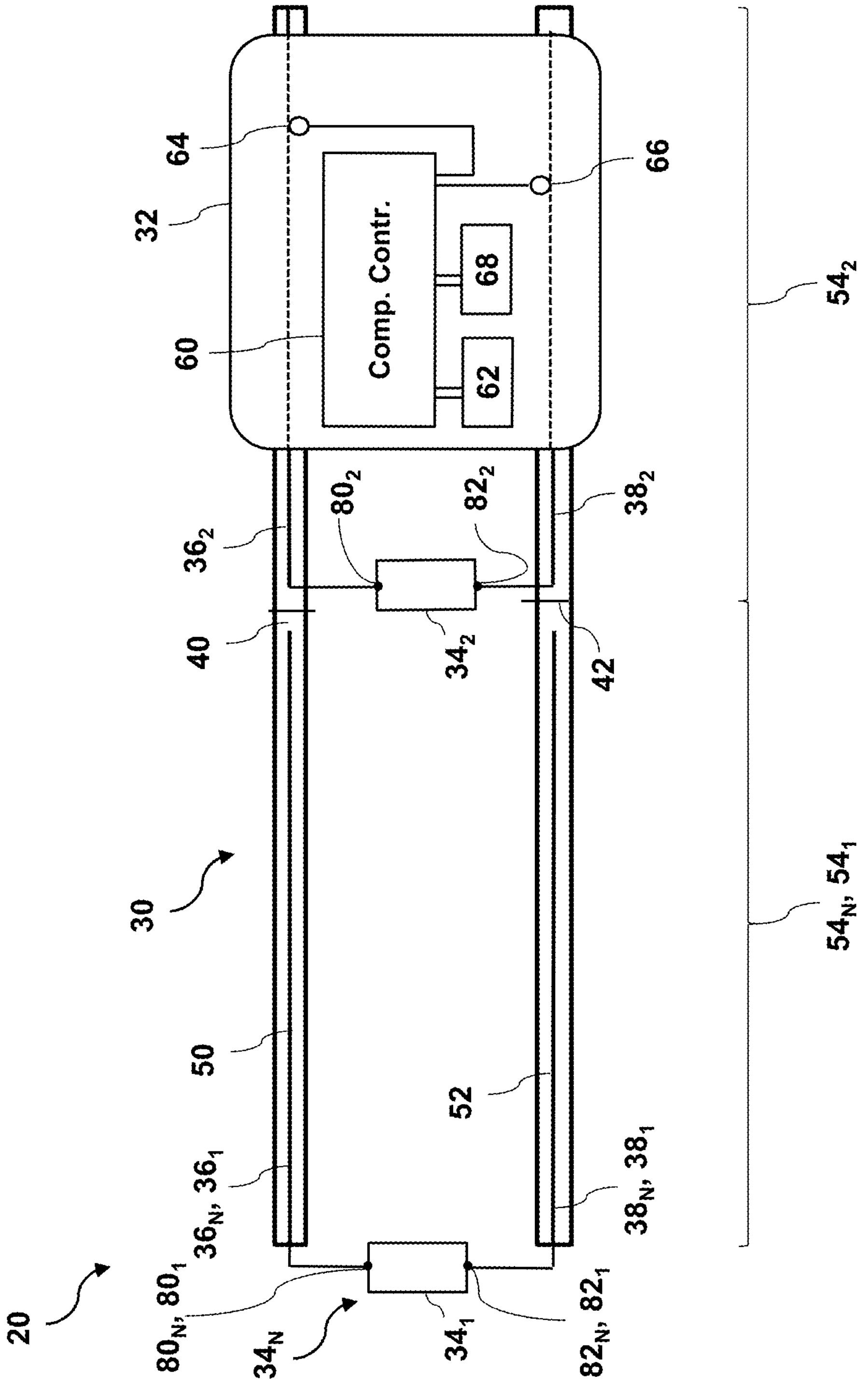
Figure 3:
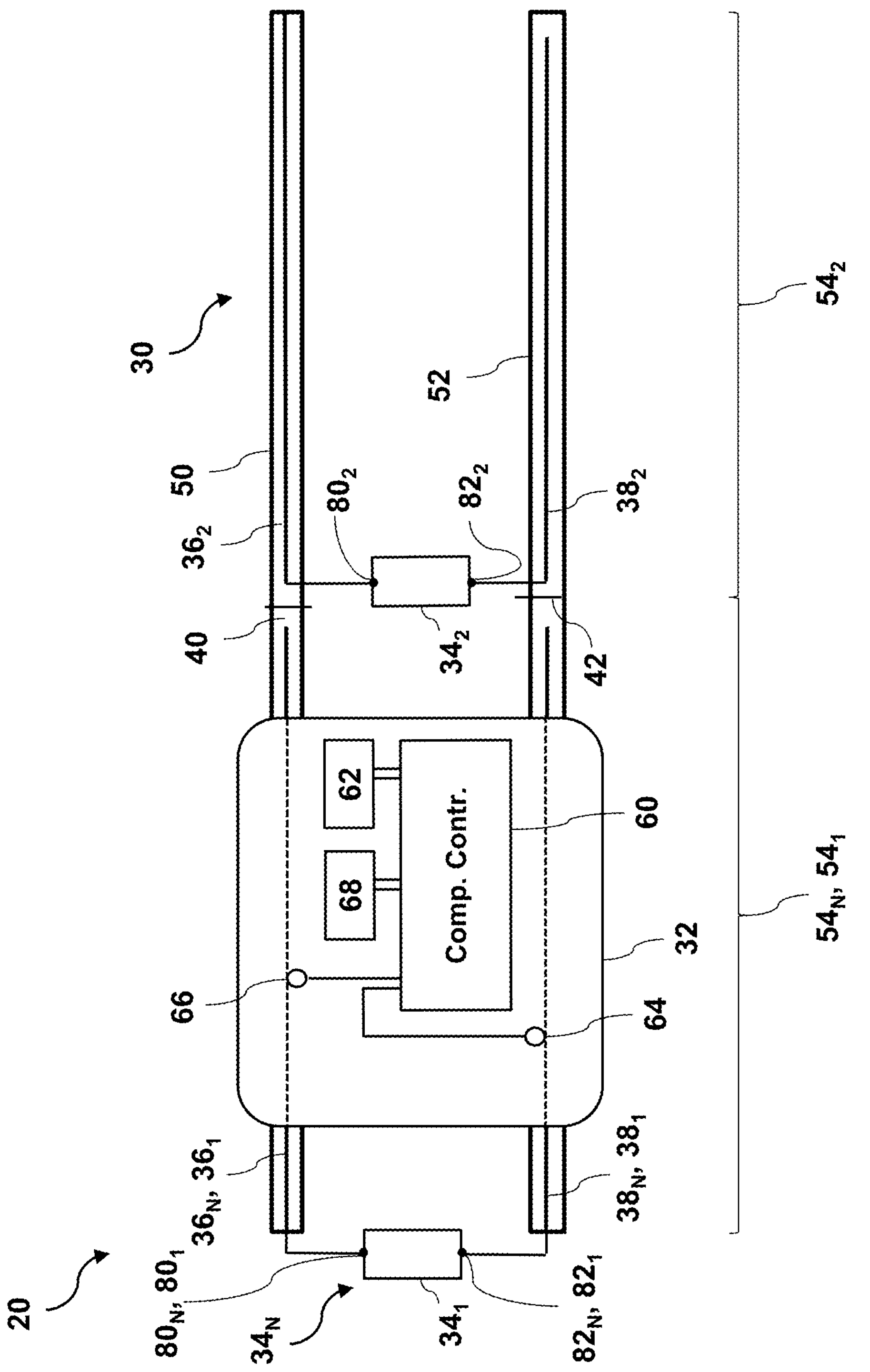

Referring to FIG. 1, an electrical assembly 20 is illustrated. The electrical assembly 20 includes a track assembly 30, a component 32, a plurality of identifiers $\mathbf{34}_N$, such as a first identifier $\mathbf{34}_1$ and a second identifier $\mathbf{34}_2$, and a plurality of conductors $\mathbf{36}_N$ and additional conductors $\mathbf{38}_N$, such as a first conductor $\mathbf{36}_1$, a first additional conductor $\mathbf{38}_1$, a second conductor $\mathbf{36}_2$, and/or a second additional conductor $\mathbf{38}_2$. The conductors $\mathbf{36}_N$ and/or the additional conductors $\mathbf{38}_N$ may be separated from each other by gaps 40 and/or insulators 42. The conductors $\mathbf{36}_N$ and the additionally conductors $\mathbf{38}_N$ comprise one or more electrically conductive materials, such as copper, aluminum, other materials, or combinations thereof. The insulators 42 comprise materials that are electrically insulating.

The track assembly 30 includes a first track 50, a second track 52, and/or a plurality of track sections $\mathbf{54}_N$, such as a first track section $\mathbf{54}_1$ and a second track section $\mathbf{54}_2$. The track sections $\mathbf{54}_N$ comprise longitudinal sections of the track assembly 30. The first track section $\mathbf{54}_1$ includes and/or is connected to the first conductor $\mathbf{36}_1$ and the first additional conductor $\mathbf{38}_1$. The additional track section(s) $\mathbf{54}_N$ include and/or are connected to the conductors $\mathbf{36}_N$ and additional conductors $\mathbf{38}_N$. For example, a second track section $\mathbf{54}_2$ is connected to the second conductor $\mathbf{36}_2$ and the second additional conductor $\mathbf{38}_2$. Optionally, the conductors $\mathbf{36}_N$ and/or the additional conductors $\mathbf{38}_N$ are configured as bus bars and/or are attached to and/or disposed at least partially in a wall (e.g., a vertical wall) of a track 50, 52.

Figure 4:
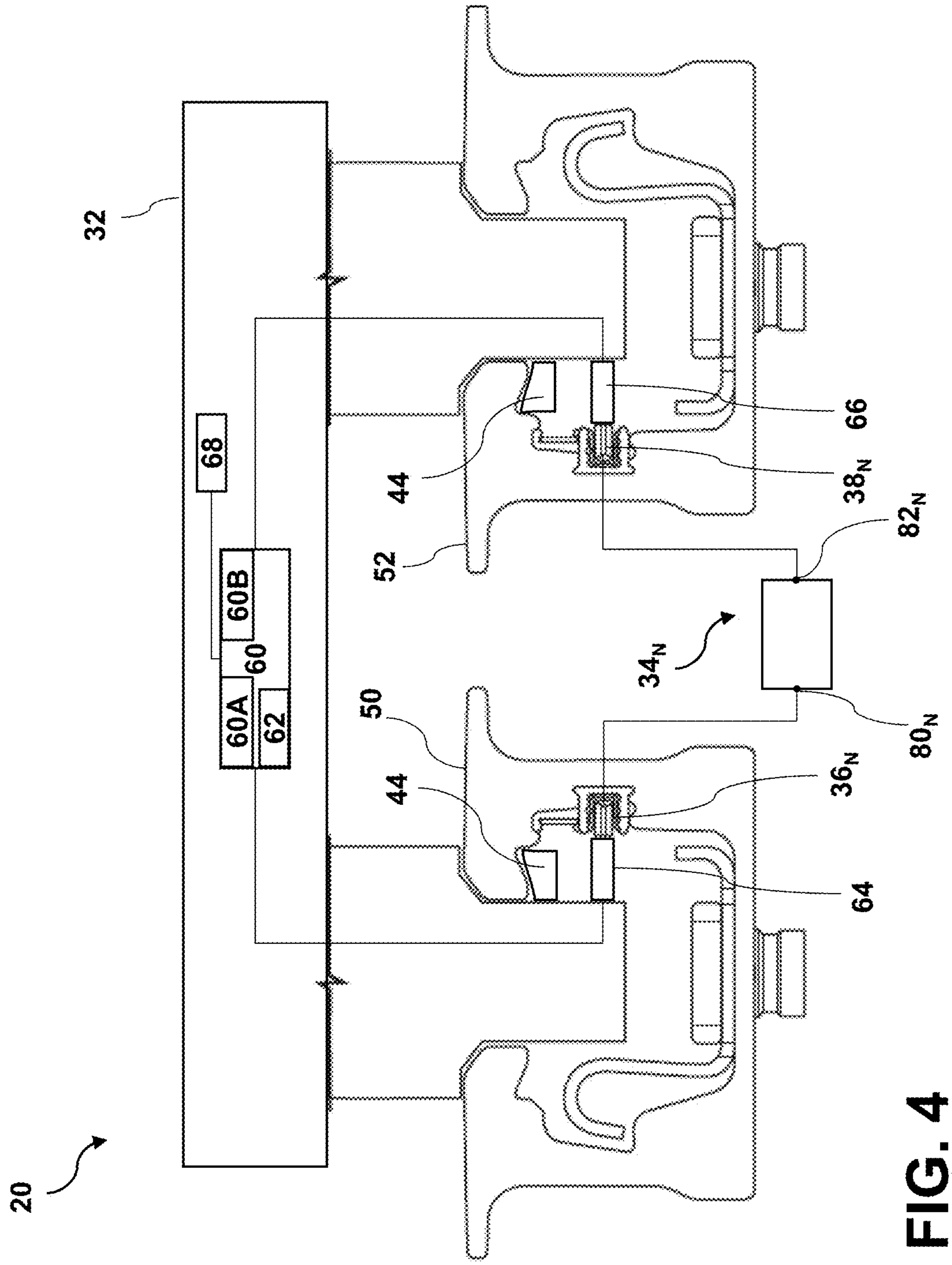
FIGS. 4 and 5 are schematic views generally illustrating embodiments of an electrical assembly according to teachings of the present disclosure.
Figure 5:
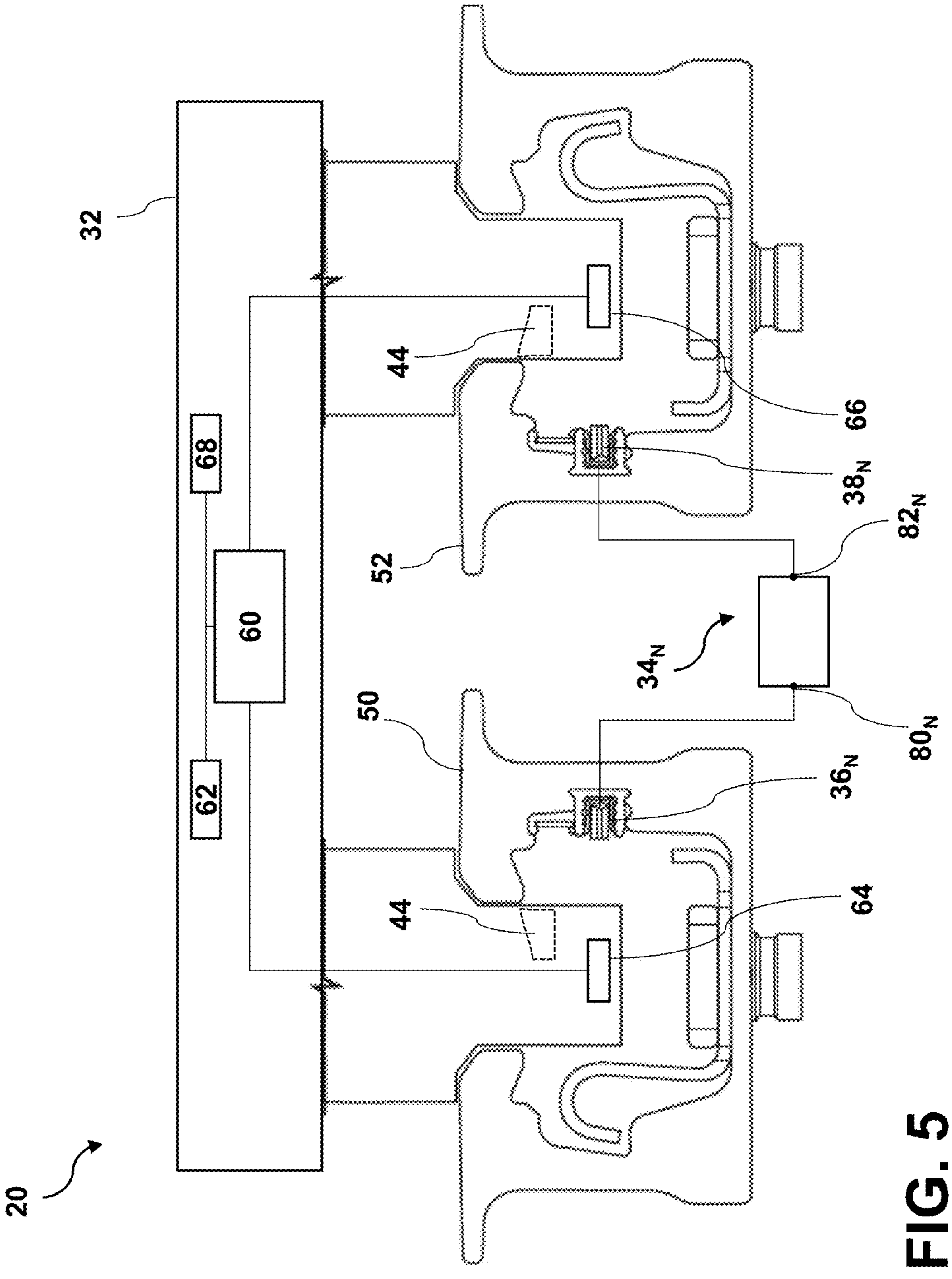

The component 32 is movably coupled with the track assembly 30. Optionally, the component 32 is configured for selective connection with, movement along and relative to (e.g., sliding), and/or removal (e.g., vertical removal) from the track assembly 30. Selective connection with the track assembly 30 includes selective electrical connection and/or selective mechanical connection. Selective mechanical connection is optionally conducted via one or more anchors 44 that can engage the track assembly 30 to restrict/prevent longitudinal movement of a component 32 along the track assembly 30 and/or restrict/prevent vertical removal of a component 32 from the track assembly 30 (see, e.g., FIG. 4).

A set of conductors $\mathbf{36}_N$ are connected to one of the first track 50 and the second track 52. A set of additional conductors $\mathbf{38}_N$ is connected to one of the first track 50 and the second track 52. In some configurations, the set of additional conductors $\mathbf{38}_N$ is connected to a different one of the tracks 50, 52 than the first conductor $\mathbf{36}_N$ (see, e.g., FIGS. 1-5). In other configurations, the set of additional conductors $\mathbf{38}_N$ is connected to the same one of the tracks 50, 52 as the first conductor $\mathbf{36}_N$ (see, e.g., FIGS. 13 and 14).

The component 32 includes a component controller 60, a sensor 62, a first contact 64 (e.g., an electrical contact), a second contact 66 (e.g., an electrical contact), and/or a safety device 68. Optionally, the component 32 is configured as a vehicle component, such as a seat or a console, among other configurations. The component controller 60 is connected to provide signals to and/or receive signals from the sensor 62, the first contact 64, the second contact 66, and/or the safety device 68. The safety device 68 can include one or more airbags, pretensioners, pyrotechnic devices, occupancy sensors, seatbelt sensors, and/or other elements.

The sensor 62 is connected to the first contact 64 and the second contact 66 and is configured to sense one or more electrical characteristics (e.g., impedance, resistance, voltage, current, among others) associated with the contacts 64, 66 and/or elements electrically connected to the contacts 64, 66. Elements electrically connected to the contacts 64, 66 can include the conductors $36_N$, $38_N$, and/or elements connected to the conductors $36_N$, $38_N$, such as the identifier $34_N$. For example, the sensor 62 may be configured to sense an impedance of an identifier $34_N$, a conductor $36_N$, and/or an additional conductor $38_N$. Optionally, some or all of the sensor 62 is integrated into the component controller 60 (see, e.g., FIGS. 4 and 6-9).

The electrical contacts 64, 66 electrically connect with the first conductor $36_N$ or the second conductor $38_N$ when the component is connected with the track assembly 30. In a first orientation of the component 32 disposed in the first section $54_1$ and with conductors $36_N$, $38_N$ connected to the tracks 50, 52, respectively (see, e.g., FIG. 1), the first electrical contact 64 is electrically connected with the first conductor $36_1$, and the second electrical contact 66 is electrically connected with the first additional conductor $38_1$. In a second orientation of the component 32 disposed in the first section $54_1$ and with conductors $36_N$, $38_N$ connected to the tracks 50, 52, respectively (see, e.g., FIG. 3), the first electrical contact 64 is electrically connected with the second conductor $38_N$, and the second electrical contact 66 is electrically connected with the first conductor $36_N$. Optionally, the contacts 64, 66 can move (e.g., rotate, tilt, translate, etc.) between an engaged position in which the contacts 64, 66 are in contact with and electrically connected to the conductors $36_N$, $38_N$ (see, e.g., FIG. 4), and a disengaged position in which the contacts 64, 66 are not in contact with or electrically connected to the conductors $36_N$, $38_N$ (see, e.g., FIG. 5), such as to facilitate removal (e.g., vertical removal) of the component 32 from the track assembly 30.

Figure 6:
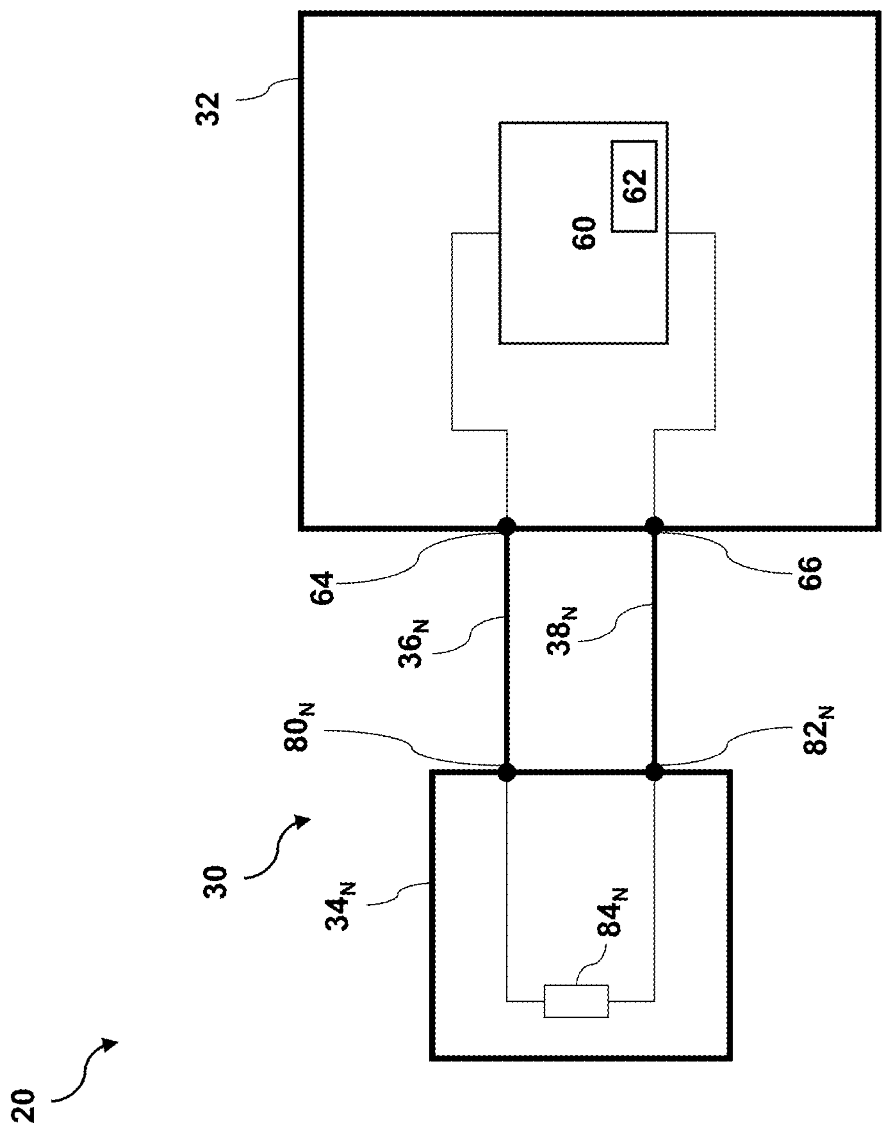
FIG. 6 is a schematic view generally illustrating embodiments of an identifier, conductors, and a component of an electrical assembly according to teachings of the present disclosure.

An identifier $34_N$ includes a first terminal $80_N$, a second terminal $82_N$, and one or more electrical devices $84_N$. For example, first and second identifiers $34_1$, $34_2$ include first terminals $80_1$, $80_2$, second terminals $82_1$, $82_2$, and one or more electrical devices $84_1$, $84_2$. The first terminal $80_N$ is electrically connected to a first conductor $36_N$. The second terminal $82_N$ is electrically connected to a second conductor $38_N$. When a component 32 is electrically connected with the track assembly 30, the component controller 60 and/or the sensor 62 is electrically connected to an identifier $34_N$. The one or more electrical devices $84_N$ can include resistors, diodes, capacitors, controllers, amplifiers, and/or other devices. In some configurations, the one or more electrical devices $84_N$ includes at least one electrical device having an impedance that can be sensed by the sensor 62. For example, as generally illustrated in FIG. 6, the one or more electrical devices $84_N$ can include a resistor $86_N$ connected to the first terminal $80_N$ and the second terminal $82_N$. The resistor $86_N$ may have a resistance/impedance that is unique relative to electrical devices $84_N$ of other identifiers $34_N$. Additionally or alternatively, in some configurations, the one or more electrical devices $84_N$ include a capacitor having a least one of a capacitance, a charging time, or a discharging time that can be sensed by the sensor 62 and/or that is unique relative to the electrical devices $84_N$ of other identifiers $34_N$.

Figure 7:
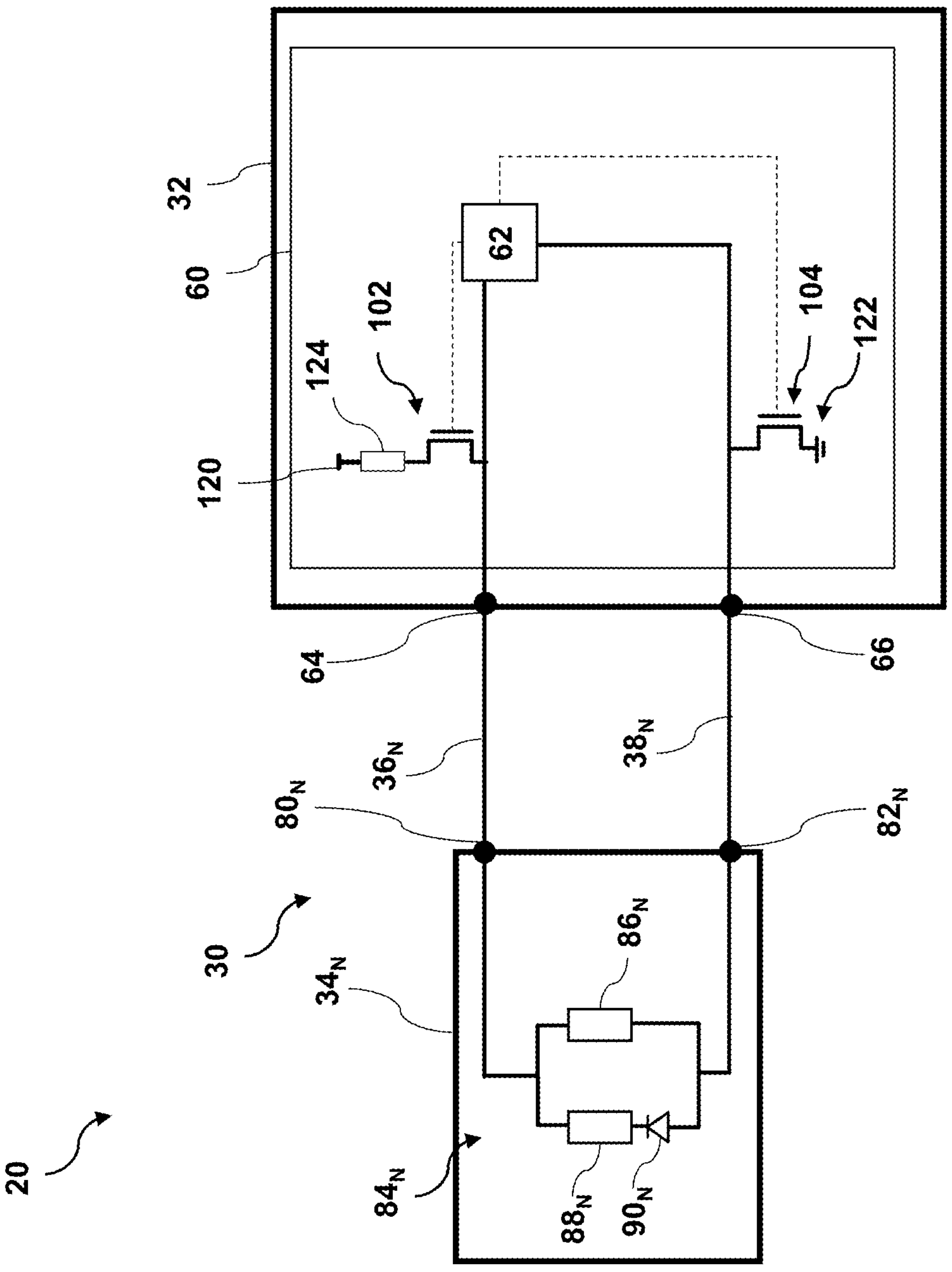
FIGS. 7 and 8 are schematic views generally illustrating embodiments of an identifier, conductors, and a component of an electrical assembly according to teachings of the present disclosure.
Figure 8:
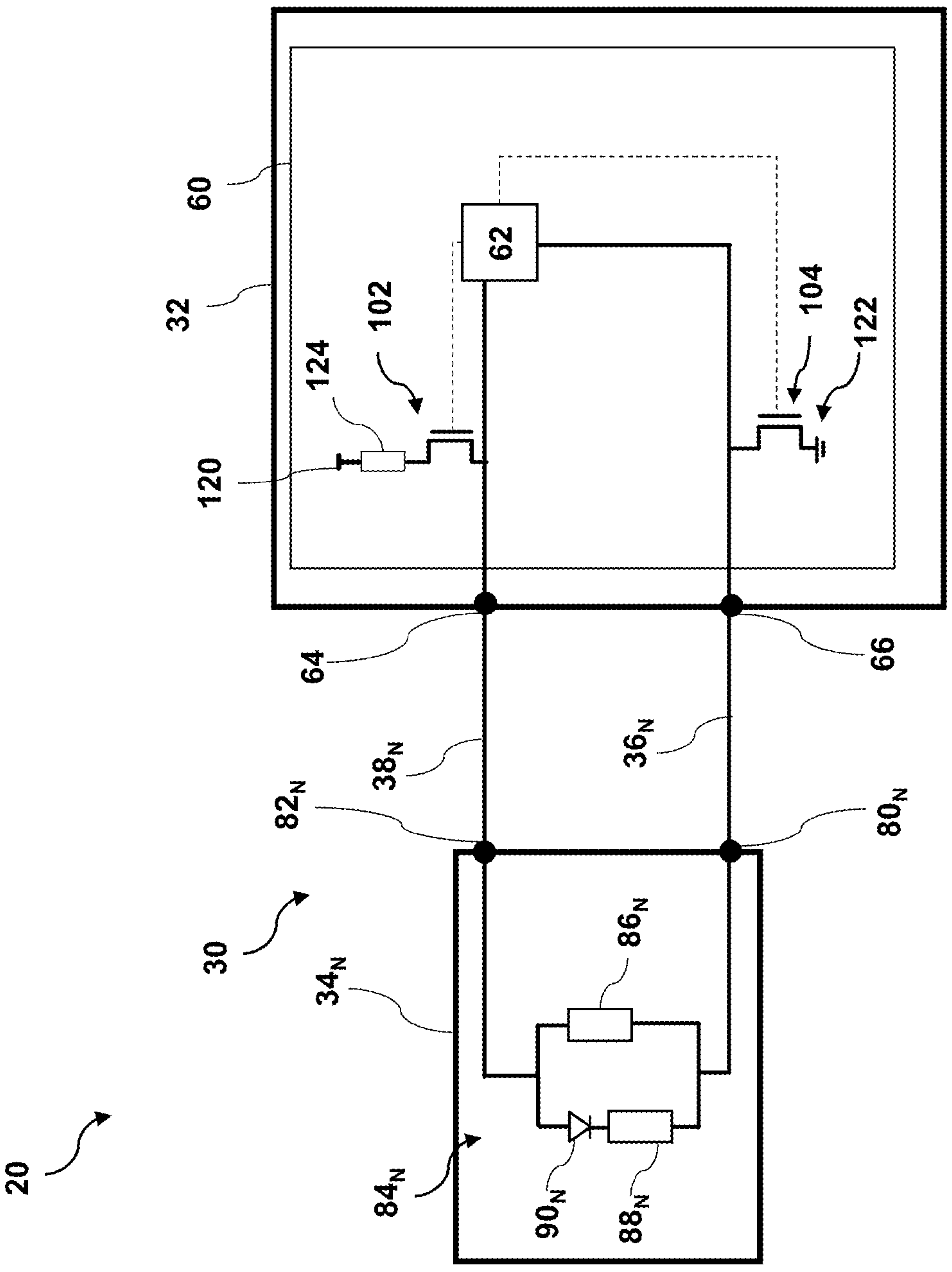

Additionally or alternatively, as generally illustrated in FIGS. 7 and 8, the one or more electrical devices $84_N$ can include a second resistor $88_N$ connected in series with a diode $90_N$, and the second resistor $88_N$ and the diode $90_N$ can be connected in parallel with the first resistor $86_N$. With the component 32 connected in the first orientation with the first contact 64 connected to a first conductor $38_N$ (see, e.g., FIG. 7), the sensor 62 senses the combined impedance of the two resistors $86_N$, $88_N$ in parallel, and with the component 32 connected in a second orientation with the first contact 64 connected to a second conductor $38_N$ (see, e.g., FIG. 8), the sensor 62 senses the impedance of the first resistor $86_N$, and the diode $90_N$ blocks the second resistor $88_N$ (see, e.g., FIG. 8).

Referring to the examples of FIGS. 7 and 8, the component controller 60 and/or the sensor 62 are configured to sense an electrical characteristic (e.g., an impedance) of the identifier $34_N$ with a first polarity and/or a second polarity. For example, the component controller 60 and/or the sensor 62 include a first switch 102 and a second switch 104. The first switch 102 is electrically connected with a voltage source 120 and the first electrical contact 64. The second switch 104 is electrically connected with the second electrical contact 66 and an electrical ground 122. A resistor 124 may be connected between the first switch 102 and the voltage source 120.

The component controller 60 is connected to control operation of the switches 102, 104. For example, if the component controller 60 closes the first switch 102 and the second switch 104 while the component 32 is in the first orientation (e.g., with the first contact 64 connected to the first conductor $36_N$ and the second contact 66 connected to the second conductor $38_N$), a voltage from the voltage source 120 may be applied with the first polarity to the identifier $34_N$. In the illustrated example, the diode $90_N$ blocks current flow with the first polarity, so current does not flow through the second resistor $88_N$, and the impedance of the identifier $34_N$ sensed by the sensor 62 (e.g., a first sensed impedance) is the impedance of the first resistor $86_N$. If the component 32 is instead in the second orientation (e.g., with the first contact 64 connected to the second conductor $38_N$ and the second contact 66 connected to the first conductor $36_N$) when the component controller 60 closes the first switch 102 and the second switch 104, a voltage from the voltage source 120 may be applied with a second polarity (e.g., opposite the first polarity) to the identifier $34_N$. In the illustrated example, the diode $90_N$ does not block current flow with the second polarity, so current flows through the first resistor $86_N$ and the second resistor $88_N$, and the impedance of the identifier $34_N$ sensed by the sensor 62 (e.g., a second sensed impedance) is the impedance of the first resistor $86_N$ and the second resistor $88_N$ in parallel (e.g., the inverse of the sum of the inverses of their respective impedances). A component controller 60 can include a component processor 60A and/or a component memory 60B (see, e.g., FIG. 4).

Each identifier $34_N$ can include a unique first and second impedance, such as by including first and second resistors $86_N$, $88_N$ having unique impedance. The first and second impedance of each identifier $34_N$ may be stored in and/or accessible by the component controller 60 such that when the sensor 62 senses a particular impedance, the component controller 60 can match the sensed impedance with a corresponding section $\mathbf{54}_N$ and orientation.

The component controller 60 may determine which section $\mathbf{54}_N$ (FIG. 3) of the track assembly 30 that the component 32 is disposed in and/or the orientation of the component 32 relative to the track assembly 30 (e.g., forward, rearward) according, at least in part, to the output of the sensor 62, which may correspond to the sensed electrical characteristic (e.g., impedance) of the identifier $\mathbf{34}_N$. For example, if the component controller 60 closes the first and second switches 102, 104 and the sensor 62 senses the first impedance of a first identifier $\mathbf{34}_N$, the component controller 60 may determine that the component 32 is in the first section $\mathbf{54}_1$ and in the first orientation. If the sensor 62 instead senses the second impedance of the first identifier $\mathbf{34}_N$, the component controller 60 may determine that the component 32 is in the first section $\mathbf{54}_1$ and in the second orientation.

Figure 9:
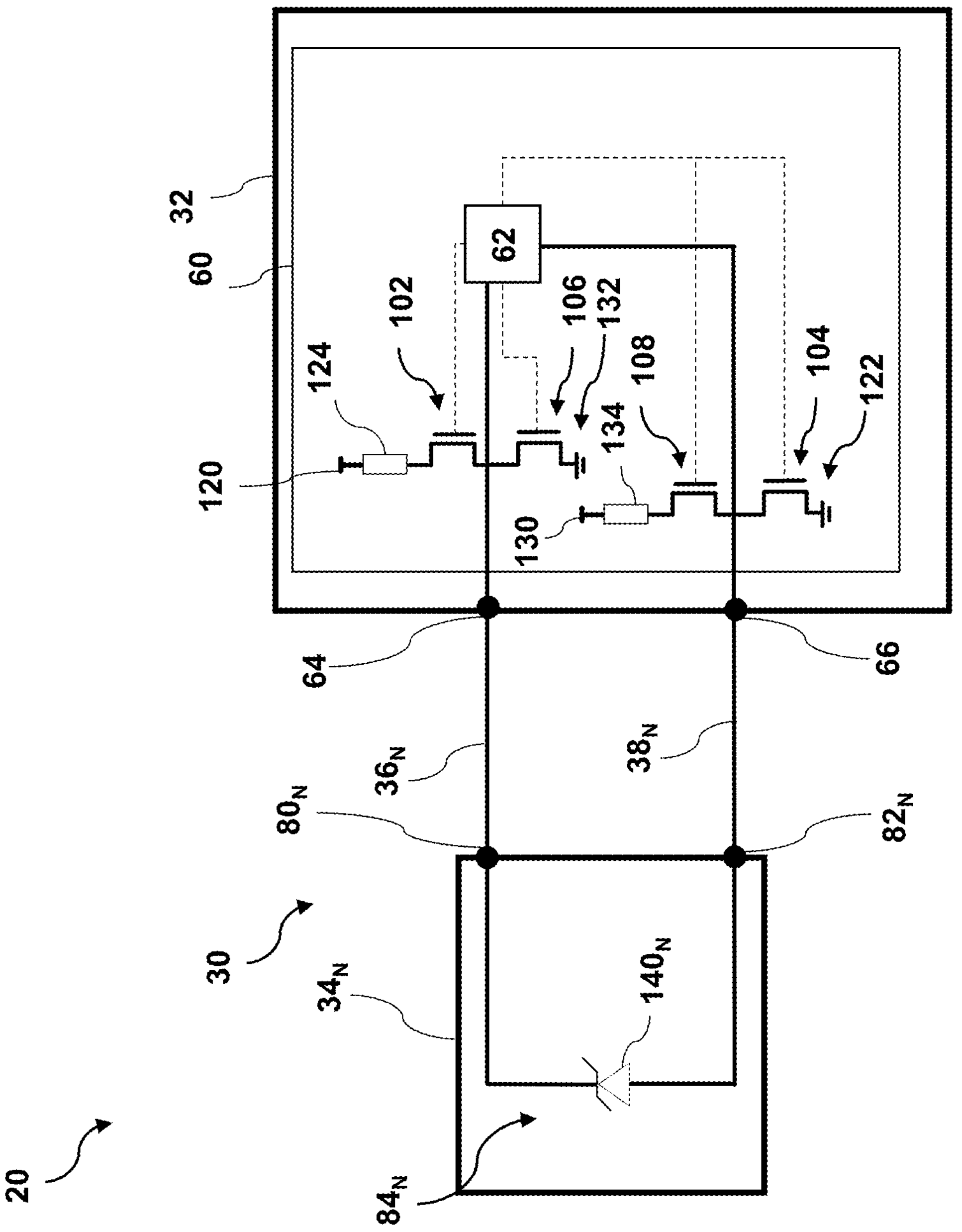
FIG. 9 is a schematic view generally illustrating embodiments of an identifier, conductors, and a component of an electrical assembly according to teachings of the present disclosure.

Referring to FIG. 9, a component 32 is illustrated with a component controller 60 and/or a sensor 62 that are configured to sense an impedance of the identifier $\mathbf{34}_N$ with a first polarity and a second polarity. For example, the component controller 60 and/or the sensor 62 include a first switch 102, a second switch 104, a third switch 106, and a fourth switch 108. The first switch 102 is electrically connected with a voltage source 120 and the first electrical contact 64. The second switch 104 is electrically connected with the second electrical contact 66 and an electrical ground 122. The third switch 106 is electrically connected with the first electrical contact 64 and an electrical ground 132, which may be same as or connected to the electrical ground 122. The fourth switch 108 is electrically connected with the second electrical contact 66 and a voltage source 130, which may be the same as or connected to the voltage source 120. A resistor 134 may be connected between the fourth switch 108 and the second electrical contact 66. The electrical device $\mathbf{84}_N$ of an identifier $\mathbf{34}_N$ may include a Zener diode $\mathbf{140}_N$.

The component controller 60 is connected to control operation of the switches 102-108. For example, if the component controller 60 closes the first switch 102 and the second switch 104 while the component 32 is in the first orientation (e.g., with the first contact 64 connected to the first conductor $\mathbf{36}_N$ and the second contact 66 connected to the second conductor $\mathbf{38}_N$), a voltage from the voltage source 120 may be applied with a first polarity to the identifier $\mathbf{34}_N$. In the illustrated example, the Zener diode $\mathbf{140}_N$ is reverse-biased with the first polarity, so if the voltage provided by the voltage source 120 is above the Zener voltage of the Zener diode $\mathbf{140}_N$, the impedance of the identifier $\mathbf{34}_N$ sensed by the sensor 62 (e.g., a first sensed impedance) corresponds to the Zener voltage of the Zener diode $\mathbf{140}_N$.

If the component controller 60 instead closes the third switch 106 and the fourth switch 108 while the component 32 is in the first orientation, a voltage from the voltage source 130 may be applied with a second polarity (e.g., opposite the first polarity) to the identifier $\mathbf{34}_N$. In the illustrated example, the Zener diode $\mathbf{140}_N$ is forward-biased with the second polarity, so the impedance of the identifier $\mathbf{34}_N$ sensed by the sensor 62 (e.g., a second sensed impedance) may correspond to the voltage drop of the Zener diode $\mathbf{140}_N$, which may, for example, be about 0.7 V for a silicon Zener diode.

Each identifier $\mathbf{34}_N$ can include a unique first impedance. For example, a Zener diode $\mathbf{140}_N$ of each identifier $\mathbf{34}_N$ can include a different Zener voltage. The second impedance of the identifiers $\mathbf{34}_N$ may be substantially the same, so the component controller 60 may operate the switches 102-108 to apply the opposite polarity to an identifier $\mathbf{34}_N$ if the original polarity resulted in the sensor 62 sensing the second impedance. The first impedance of each identifier $\mathbf{34}_N$ may be stored in and/or accessible by the component controller 60 such that when the sensor 62 senses a particular first impedance, the component controller 60 can match the sensed first impedance with a corresponding section $\mathbf{54}_N$.

The component controller 60 may determine which section $\mathbf{54}_N$ (FIG. 3) of the track assembly 30 that the component 32 is disposed in and/or the orientation of the component 32 relative to the track assembly 30 (e.g., forward, rearward) according, at least in part, to the output of the sensor 62, which may correspond to the sensed impedance of the identifier $\mathbf{34}_N$. For example, if the component controller 60 closes the first and second switches 102, 104 and the sensor 62 senses a first impedance associated with the Zener diode $\mathbf{140}_N$ of a first identifier $\mathbf{34}_N$, the component controller 60 may determine that the component 32 is in the first section $\mathbf{54}_1$ and in the first orientation. If the sensor 62 instead senses the second impedance of the Zener diode $\mathbf{140}_N$ of the first identifier $\mathbf{34}_N$, the component controller 60 may determine that the component 32 is in the second orientation. If the sensor 62 senses the second impedance, the component controller 60 may apply the opposite polarity to obtain the first impedance of the identifier $\mathbf{34}_N$ to determine which section $\mathbf{54}_N$ the component 32 is disposed in.

Figure 10:
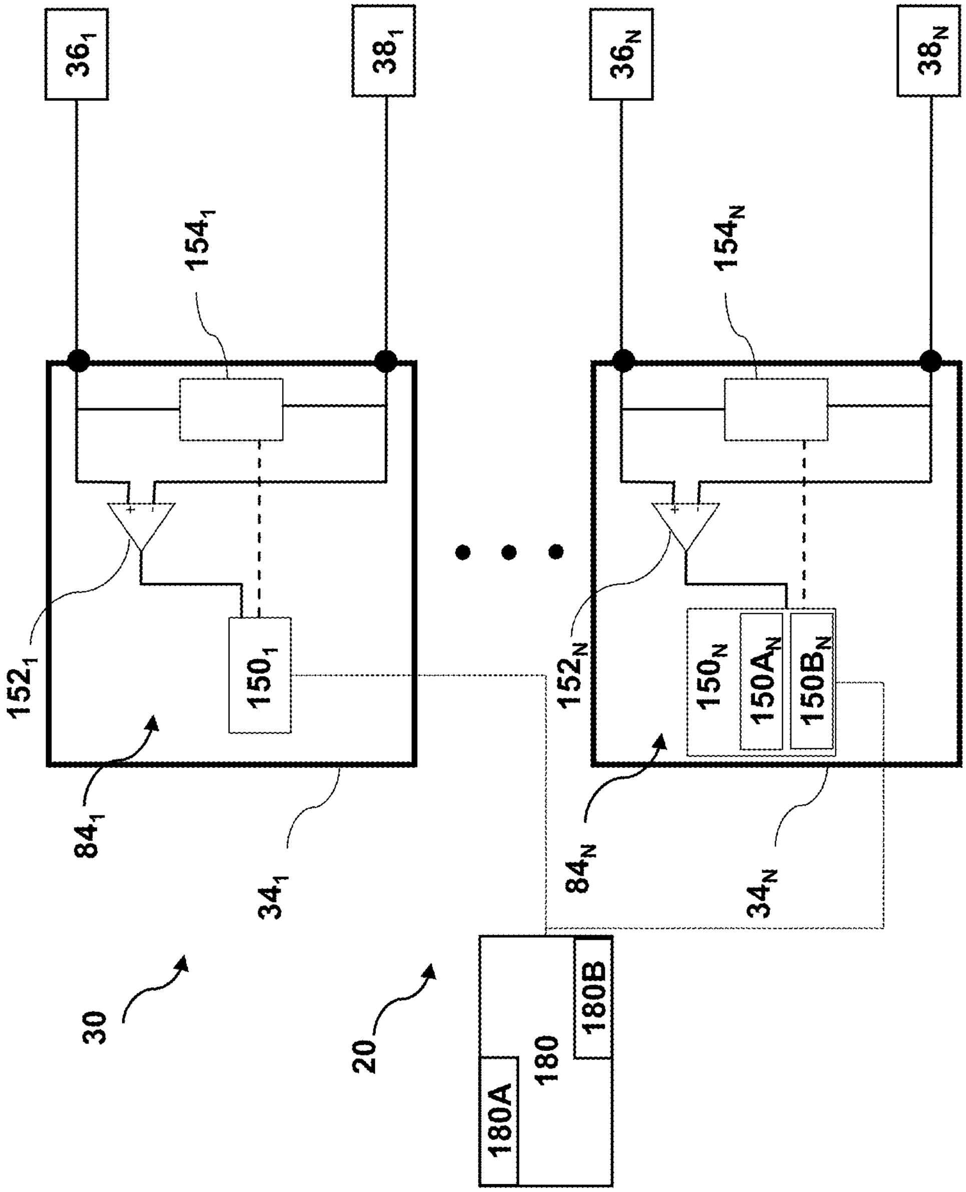
FIG. 10 is a schematic view generally illustrating embodiments of identifiers, conductors, and a component of an electrical assembly according to teachings of the present disclosure.

Referring to FIG. 10, an identifier $\mathbf{34}_N$ optionally includes an active configuration. For example, an identifier $\mathbf{34}_N$ can include an identifier controller $\mathbf{150}_N$, a comparator $\mathbf{152}_N$, and/or a variable impedance device $\mathbf{154}_N$ (e.g., a digital potentiometer). For example, a first identifier $\mathbf{34}_1$ includes an identifier controller $\mathbf{150}_1$, a comparator $\mathbf{152}_1$, and/or a variable impedance device $\mathbf{154}_1$. The comparator $\mathbf{152}_N$ is connected to the first terminal $\mathbf{80}_N$ and the second terminal $\mathbf{82}_N$, and provides an output to the identifier controller $\mathbf{150}_N$ corresponding to the voltage provided by the component controller 60 and/or the sensor 62. If the output from the comparator $\mathbf{152}_N$ positive, such as when the first contact 64 is connected with the first conductor $\mathbf{36}_N$, the identifier controller $\mathbf{150}_N$ can control the variable impedance device $\mathbf{154}_N$ to provide an impedance (e.g., a first impedance) corresponding to the component 32 being disposed in the first section $\mathbf{54}_1$ and having the first orientation. If the output from the comparator $\mathbf{152}_N$ is negative, such as when the second contact 66 is connected with the first conductor $\mathbf{36}_N$, the identifier controller $\mathbf{150}_N$ can control the variable impedance device $\mathbf{154}_N$ to provide a different impedance (e.g., a second impedance) corresponding to the component 32 being disposed in the first section $\mathbf{54}_1$ and having the second orientation. An identifier controller $\mathbf{150}_N$ may include a processor $\mathbf{150A}_N$ and/or a memory $\mathbf{150B}_N$.

One or more additional identifiers $\mathbf{34}_N$ can be connected to respective additional conductors $\mathbf{36}_N$, $\mathbf{38}_N$ of additional sections $\mathbf{54}_N$ of the track assembly 30. For example, each additional identifier $\mathbf{34}_N$ can include an identifier controller $\mathbf{150}_N$ that controls a variable impedance device $\mathbf{154}_N$, such as according to the output of a comparator $\mathbf{152}_N$, to provide a first impedance and a second impedance that are different from each other identifier $\mathbf{34}_N$.

Optionally, the component controller 60 can communicate with an identifier controller $\mathbf{150}_N$ to obtain information other than component section and orientation information. For example, if the component controller 60 provides a first component electrical characteristic, such as voltage (e.g., 5 V), the identifier controller $\mathbf{150}_N$ may control the variable impedance device $\mathbf{154}_N$ to provide the first or second impedance corresponding to the component section and orientation, and if the component controller 60 provides a second electrical characteristic, such as a voltage (e.g., 3 V), the identifier controller $\mathbf{150}_N$ may control the variable impedance device $\mathbf{154}_N$ to provide a third impedance corresponding to a different parameter, such as, for example and without limitation, battery voltage, battery charge level, vehicle speed, and/or other parameters. Optionally, some or all of the identifier controllers $\mathbf{150}_N$ are partially or completely included with another controller 180, such as a vehicle controller for vehicle applications. Additionally or alternatively, the identifier controllers $\mathbf{150}_N$ are in communication with the controller 180. In some configurations, each component 32 may provide a unique electrical characteristic (e.g., voltage, impedance, etc.) to an identifier 34. The identifier controller $\mathbf{150}_N$ and/or the controller 180 may utilize the electrical characteristic provided by a component 32 to identify the component 32. For example and without limitation, a component 32 may provide a unique voltage and/or a unique impedance that can be sensed via an identifier controller $\mathbf{150}_N$ and/or a controller 180. The controller 180 may include a processor 180A and/or a memory 180B.

Figure 11:
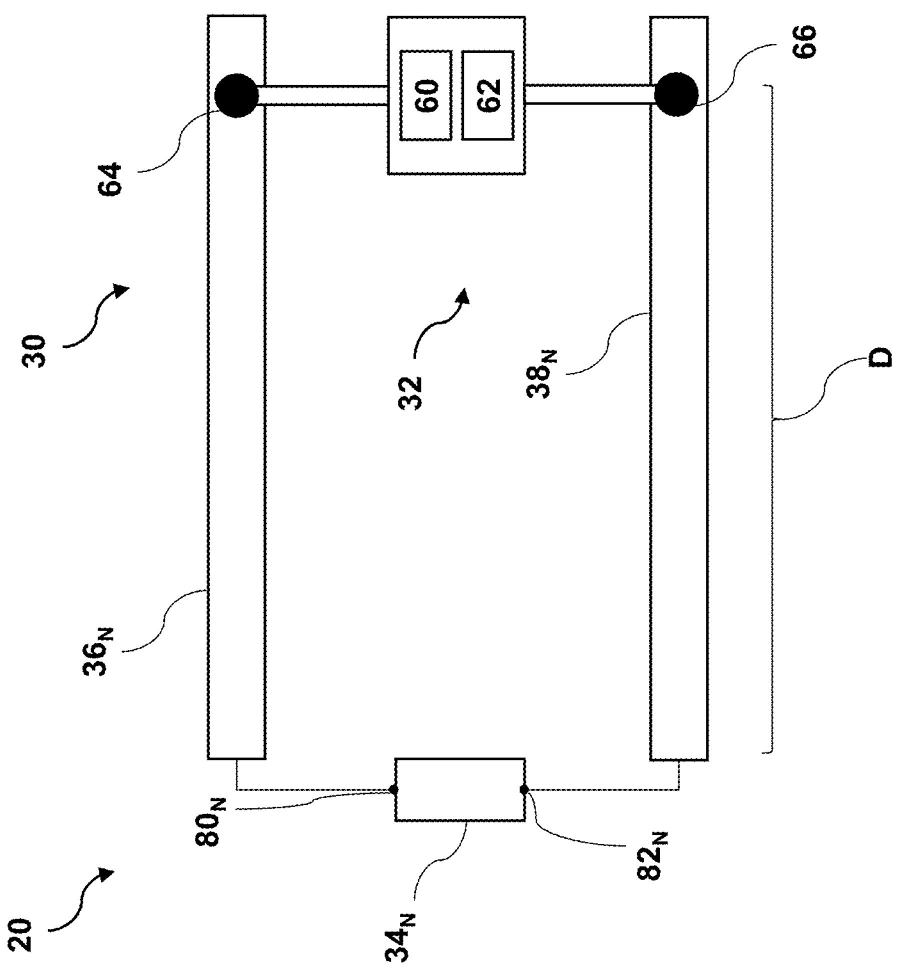
FIGS. 11 and 12 are schematic views generally illustrating embodiments of an identifier, conductors, and a component of an electrical assembly according to teachings of the present disclosure.
Figure 12:
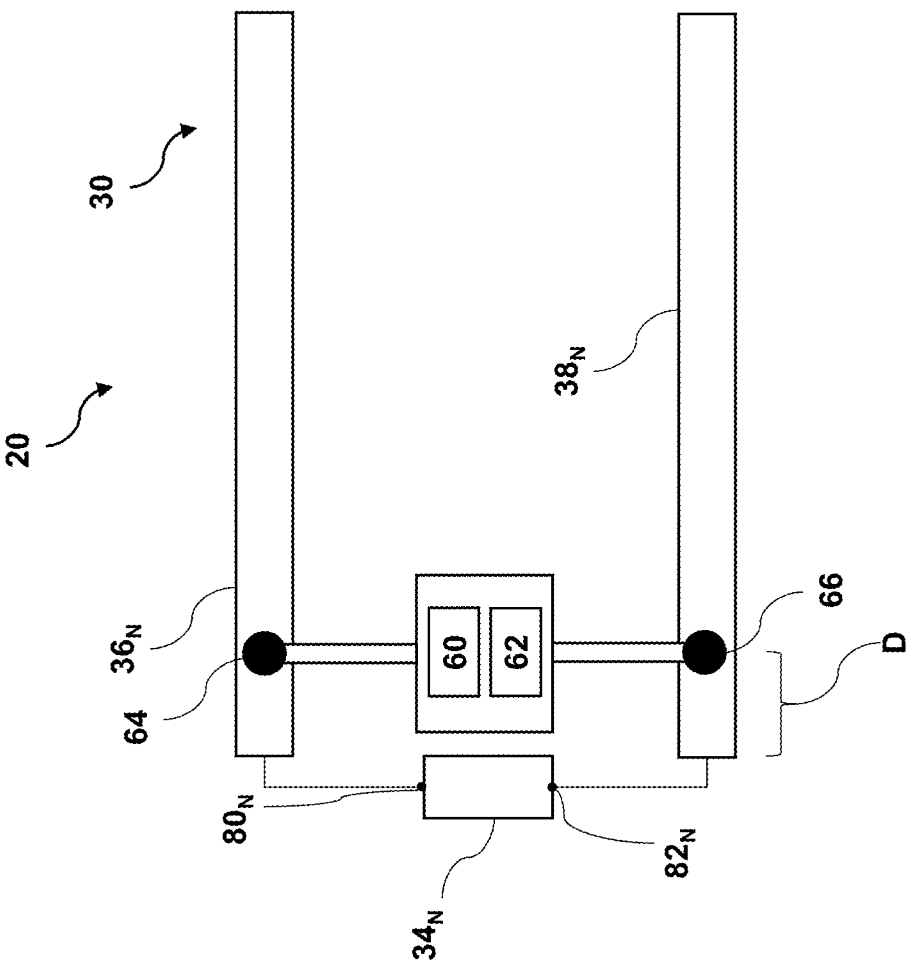

Referring to FIGS. 11 and 12, optionally, the component controller 60 and/or the sensor 62 determine a position of a component 32 within a section $\mathbf{54}_N$ according, at least in part to a resistivity of the conductors $\mathbf{36}_N$, $\mathbf{38}_N$. The resistivity includes a resistance per unit length, so the impedance sensed by sensor 62 when sensing the impedance of an identifier $\mathbf{34}_N$ will vary depending on the distance D of the component 32 from the connection of the identifier $\mathbf{34}_N$ to the conductors $\mathbf{36}_N$, $\mathbf{38}_N$. For example, the impedance sensed by the sensor 62 may correspond to the sum of (i) the impedance of the identifier $\mathbf{34}_N$ and (ii) a product of the combined resistivity of the conductors $\mathbf{36}_N$, $\mathbf{38}_N$ and the distance D from the identifier connection. The component controller 60 may utilize that relationship to determine the position of the component 32 within the section $\mathbf{54}_N$ (e.g., the distance D from the connection of the identifier $\mathbf{34}_N$ to the conductors $\mathbf{36}_N$, $\mathbf{38}_N$). For example larger sensed impedances can indicate a greater distance D (e.g., FIG. 11) and smaller sensed impedances can indicate a shorter distance D (e.g., FIG. 12).

With some configurations, a total range of impedance for each section $\mathbf{54}_N$, which may include the sum of impedance of the identifier $\mathbf{34}_N$ and a maximum impedance of the conductors $\mathbf{36}_N$, $\mathbf{38}_N$ (e.g., when the component 32 is farthest from the identifier connection), may be unique for each section $\mathbf{54}_N$. With such configurations, the component controller 60 may initially determine which section $\mathbf{54}_N$ the component 32 is disposed in according to the sensed impedance. The component controller 60 may then determine the position of the component 32 in the section $\mathbf{54}_N$ by subtracting the impedance of the identifier $\mathbf{34}_N$ of the determined section $\mathbf{54}_N$, which may be stored in and/or accessible by the component controller 60, and dividing that difference by the combined resistivity of the conductors $\mathbf{36}_N$, $\mathbf{38}_N$ to obtain the distance D. In some configurations, the identifier $\mathbf{34}_N$ is to connected to the same ends (e.g., forward ends or rearward ends) of the conductors $\mathbf{36}_N$, $\mathbf{38}_N$. Optionally, the conductors $\mathbf{36}_N$, $\mathbf{38}_N$ include a material with a resistivity greater than copper, such as stamped steel, among other possible materials.

Figure 13:
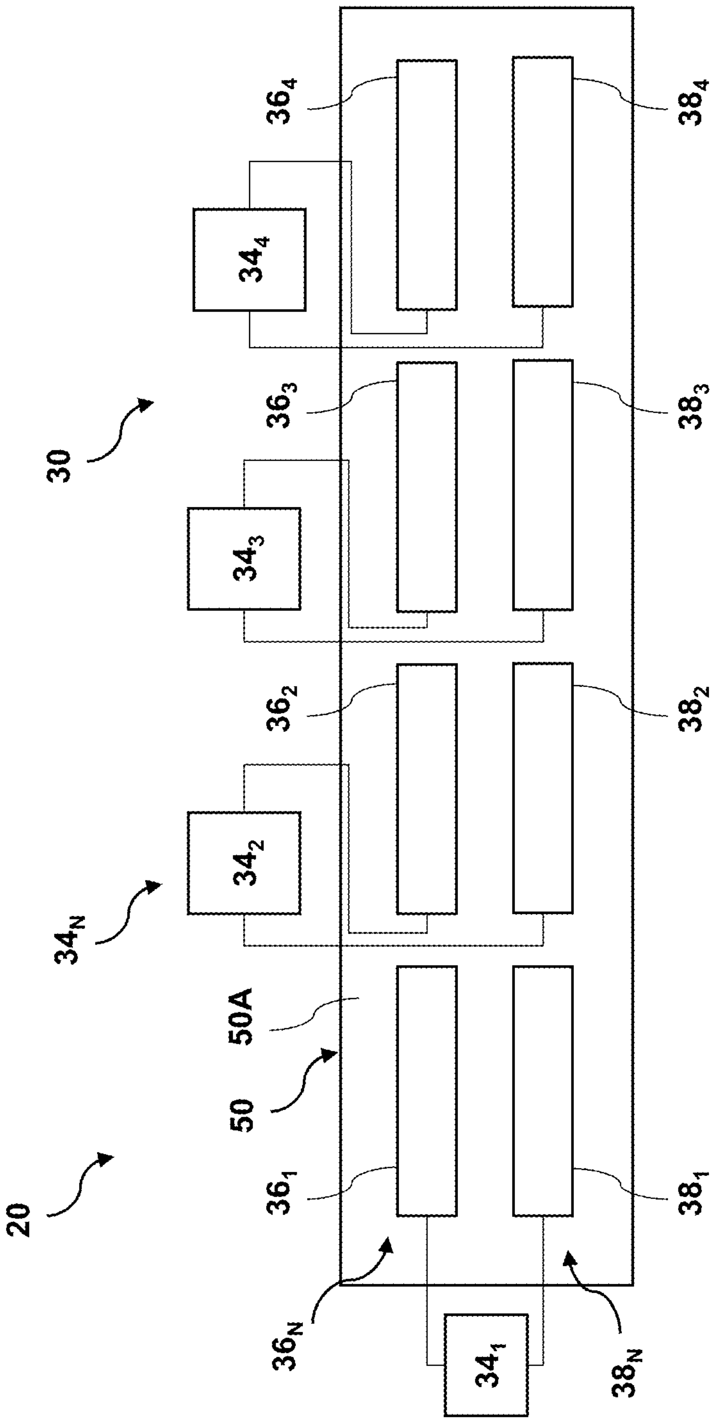
FIG. 13 is a schematic view generally illustrating embodiments identifiers, conductors, and a track wall of an electrical assembly according to teachings of the present disclosure.
Figure 14:
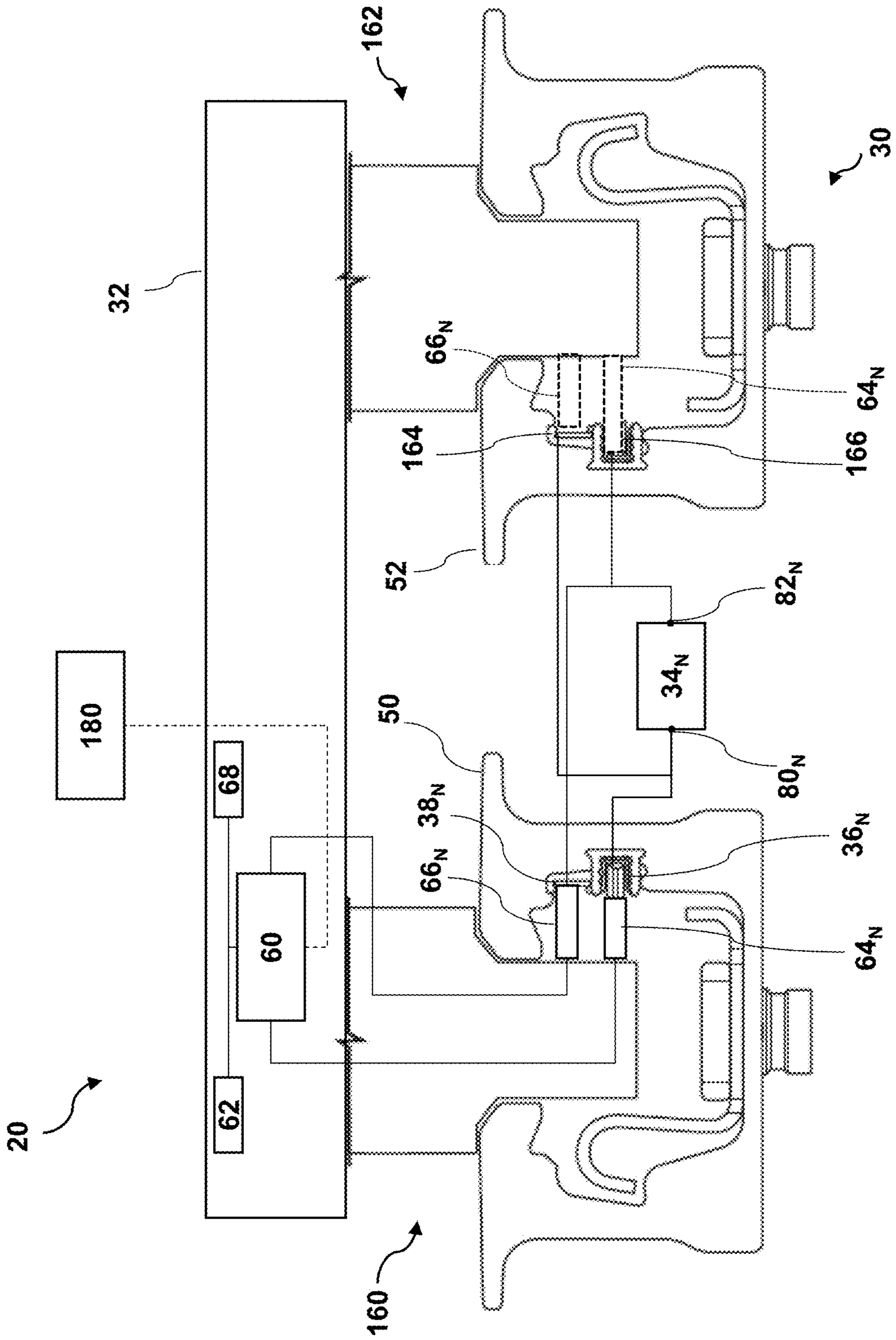
FIG. 14 is a schematic view generally illustrating an embodiment of an electrical assembly according to teachings of the present disclosure.

Referring to FIGS. 13 and 14, the conductors $\mathbf{36}_N$, $\mathbf{38}_N$ are optionally connected to the same track, such as a first track 50, and/or to the same wall 50A of a first track 50. For example, conductors $\mathbf{36}_{1\text{-}4}$ and additional conductors $\mathbf{38}_{1\text{-}4}$ can be connected to the same wall 50A, and respective identifiers $\mathbf{34}_{1\text{-}4}$ can be connected thereto. If the component 32 includes a dual track configuration, a first side 160 of the component 32 may include both contacts 64, 66, and a second side 162 of the component 32 may not include either of the contacts 64, 66. Optionally, such as generally illustrated in FIG. 14, a second track 52 includes third and fourth conductors 164, 166 disposed such that when the component 32 is connected with the tracks 50, 52 in a second orientation (e.g., with the first side 160 engaged with the second track 52, and the second side 162 engaged with the track 50), the contacts 64, 66 may contact and electrically connect with the third and fourth conductors 164, 166 (see dashed lines in FIG. 14). The third and fourth conductors 164, 166 may be electrically connected to the identifier $\mathbf{34}_N$ in an opposite configuration from the conductors $\mathbf{36}_N$, $\mathbf{38}_N$ such that, if the first and contacts 64, 66 are electrically connected to the first and second terminals $\mathbf{80}_N$, $\mathbf{82}_N$, respectively, when the component 32 is in the first orientation, and the first and contacts 64, 66 are electrically connected to the second and first terminals $\mathbf{82}_N$, $\mathbf{80}_N$, respectively, when the component 32 is in the second orientation.

In some configurations, the conductors $\mathbf{36}_N$, $\mathbf{38}_N$ may take the form of the tracks 50, 52 and be included with the track assembly 30. In such configurations, the identifiers $\mathbf{34}_N$ may be connected directly to the tracks 50, 52, the sections $\mathbf{54}_N$ of the track assembly 30 may be electrically isolated from each other, and/or the track assembly 30 may be electrically isolated from the mounting surface and/or electrical ground.

Figure 15:
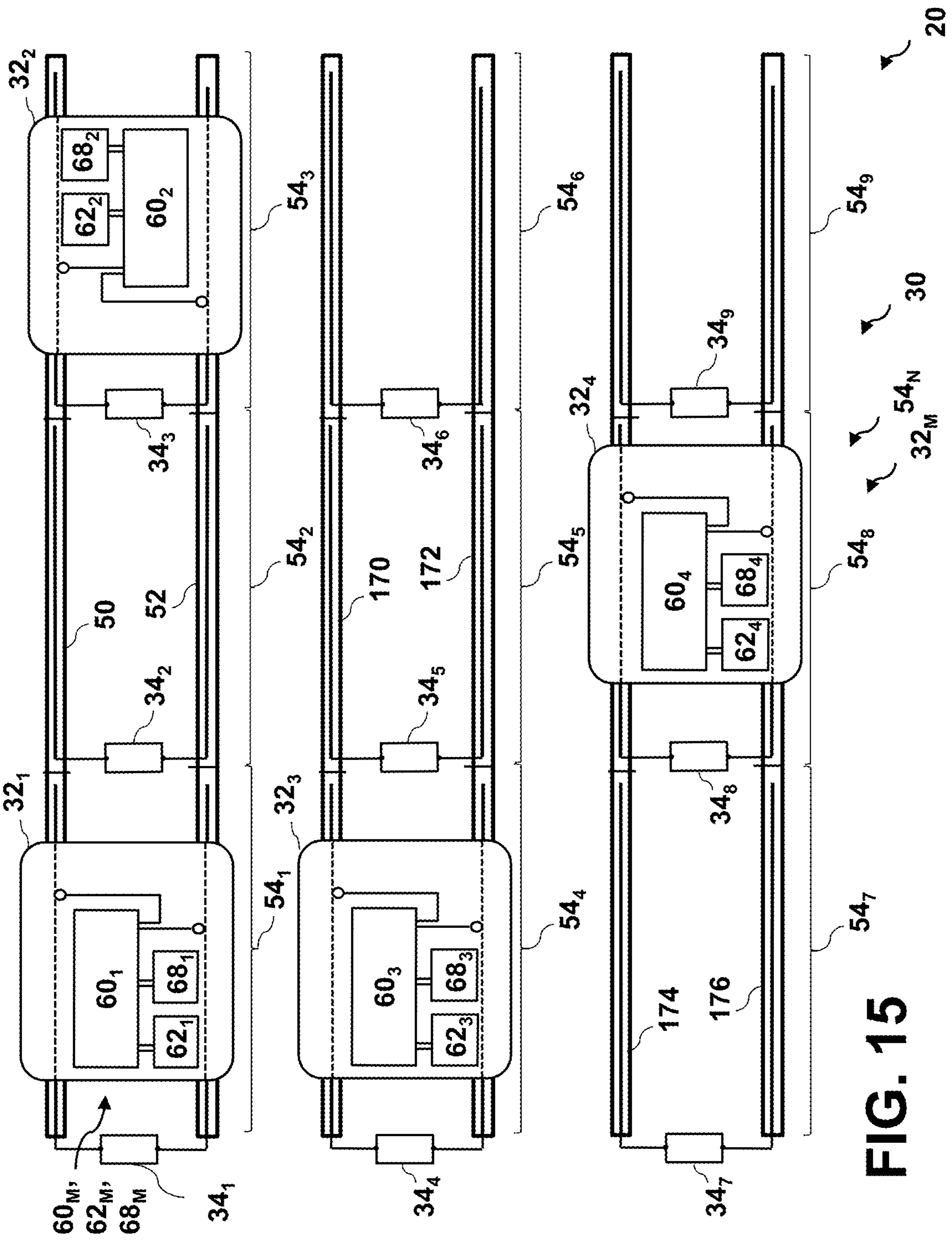
FIG. 15 is a schematic view generally illustrating an embodiment of an electrical assembly according to teachings of the present disclosure.

While various examples have been illustrated and described in connection with a first track 50 and a second track 52, a track assembly 30 may include other numbers of tracks with additional track sections $\mathbf{54}_N$ (see, e.g., FIG. 15). For example and without limitation, a track assembly 30 may include a first track 50, a second track 52, a third track 170, a fourth track 172, a fifth track 174, and/or a sixth track 176, each with respective track sections $\mathbf{54}_N$ (e.g., sections $\mathbf{54}_{1\text{-}9}$), conductors (e.g., conductors $\mathbf{36}_{1\text{-}9}$, $\mathbf{38}_{1\text{-}9}$), and/or identifiers (e.g., identifiers $\mathbf{34}_{1\text{-}9}$). A component controller $\mathbf{60}_M$ (e.g., component controllers $\mathbf{60}_{1\text{-}4}$) may be configured to determine which section of the plurality of sections $\mathbf{54}_N$ (e.g., sections $\mathbf{54}_{1\text{-}9}$) a component 32 is connected to and/or an orientation of the component 32, such as according to an electrical characteristic (e.g., an impedance) of the respective identifier $\mathbf{34}_N$ sensed via the sensors $\mathbf{62}_M$ (e.g., sensors $\mathbf{62}_{1\text{-}4}$). In some configurations, the tracks 50, 52, 170-176 are parallel with each other.

A plurality of components $\mathbf{32}_N$ (e.g., components $\mathbf{32}_{1\text{-}4}$) can be connected to the same track assembly 30. The component controllers $\mathbf{60}_M$ of the components $\mathbf{32}_M$ may be configured to determine which section of the plurality of sections $\mathbf{54}_N$ (e.g., sections $\mathbf{54}_{1\text{-}9}$) a component $\mathbf{32}_N$ is connected to and/or an orientation of the component $\mathbf{32}_M$, such as according to an electrical characteristic (e.g., an impedance) of the respective identifier $\mathbf{34}_N$ sensed via a sensor $\mathbf{62}_M$. The components $\mathbf{32}_N$ may include respective safety devices $\mathbf{68}_M$.

In some configurations, the component controllers $\mathbf{60}_M$ are configured to compensate for the presence (e.g., impedance, capacitance, charging time, discharging time, etc.) of additional components $\mathbf{32}_M$ connected to the same section $\mathbf{54}_2$. For example and without limitation, an expected impedance and/or capacitance of a component $\mathbf{32}_M$ may be stored in and/or accessible by the component controllers $\mathbf{60}_M$, and if a sensed impedance and/or capacitance is above a threshold, the component controller $\mathbf{60}_M$ may subtract a component impedance and/or capacitance from the sensed value.

Additionally or alternatively, the length of the sections $54_N$ optionally corresponds to the size of the components $32_N$ such that not more than one component $32_M$ is electrically connected to the same section $54_N$ at a time.

With embodiments, an electrical assembly 20 may be configured such that the position and/or orientation of a component 32 relative to a track assembly 30 can be determined, such as via a component controller 60. The component controller 60 may utilize the position and/or orientation information to control one or more functions of the component 32 (e.g., movement), control actuation of one or more safety devices 68, and/or provide the information to another controller (e.g., controller 180). For example, certain safety devices 68 may or may not be actuated, and/or a sequencing of actuation may change, depending on the position and orientation of the component 32. In some configurations, the identifiers $34_N$ may include passive components and may not include active/powered components (see, e.g., FIGS. 6-9). In other configurations, the identifiers $34_N$ may include active components (see, e.g., FIGS. 10 and 11), or a combination thereof. The component controllers 60 may be in communication (e.g., wired and/or wireless) with another controller 180, which may, for vehicle applications, include a vehicle controller configured to control one or more systems of a vehicle (e.g., propulsion, braking, infotainment, safety, among others).

Figure 16:
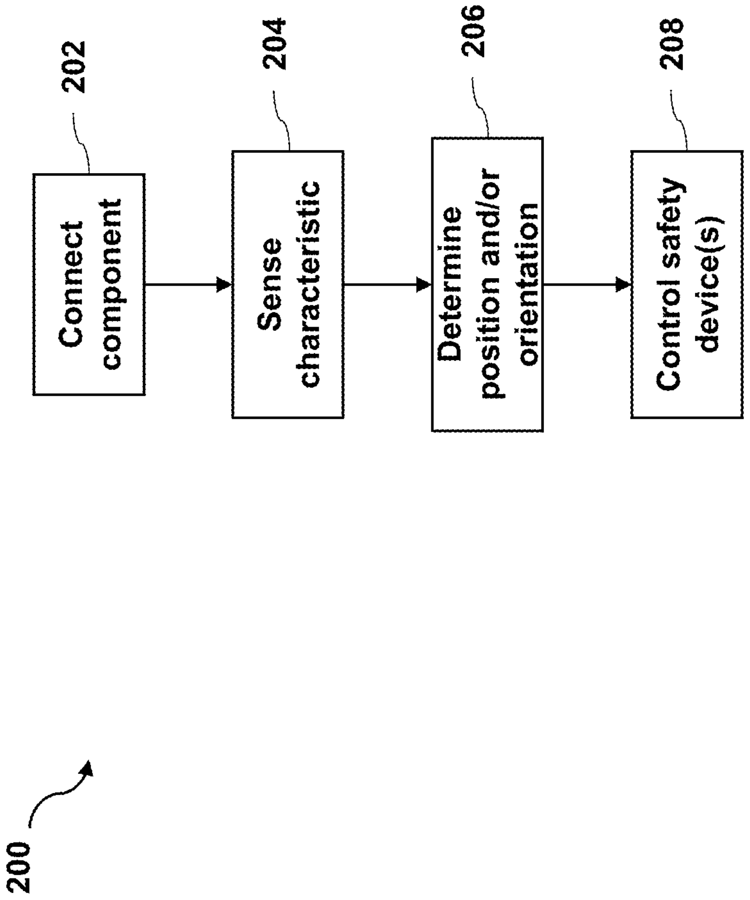
FIG. 16 is a flow diagram generally illustrating an embodiment a method of operating an electrical assembly according to teachings of the present disclosure.

A method 200 of operating an electrical assembly 20 is illustrated in FIG. 16. The method 200 includes connecting a component 32 to a track assembly 30 (block 202). The method 200 includes sensing, via a component controller 60 and/or a sensor 62, an electrical characteristic of an identifier $34_N$ electrically connected to a pair of conductors $36_N$, $38_N$ (block 204). The method 200 includes the component controller 60 determining a position and/or an orientation of the component 32 relative to the track assembly 30 according to an output of the sensor 62 and/or an electrical characteristic of the identifier $34_N$ (block 206). Determining the position can include determining which section of a plurality of sections $54_N$ the component 32 is connected to, such as according to the electrical characteristic of the identifier $34_N$. Additionally or alternatively, the component controller 60 may determine the position of the component 32 within a section $54_N$ according to the electrical characteristic and/or one or more resistivities of the conductors $36_N$, $38_N$. Optionally, the method 200 includes a component controller 60 controlling operation of one or more safety devices $68_N$ according to the determined position and/or orientation (block 208). Component controllers $60_M$ of other components $32_N$ may conduct the method 200 at the same or a different time to determine the position and/or orientation of the other components $32_M$.

The instant disclosure includes the following non-limiting embodiments:

An electrical assembly, comprising: a track assembly; a conductor connected to the track assembly; an additional conductor connected to the track assembly; an identifier including a first terminal electrically connected to the conductor and a second terminal electrically connected to the additional conductor; and a component movably coupled with the track assembly, the component including a sensor configured to sense an electrical characteristic of the identifier.

The electrical assembly according to any preceding embodiment, wherein the identifier includes a resistor and/or a diode.

The electrical assembly according to any preceding embodiment, wherein the conductor is connected to a first track of the track assembly; and the additional conductor is connected to a second track of the track assembly.

The electrical assembly according to any preceding embodiment, wherein the first conductor and the second conductor are connected to a first track of the track assembly.

The electrical assembly according to any preceding embodiment, further comprising one or more additional identifiers electrically connected to one or more other pairs of conductors and additional conductors connected to the track assembly.

The electrical assembly according to any preceding embodiment, wherein each pair of the one or more pairs of conductors and additional conductors includes a second conductor connected to a first track of the track assembly and a second additional conductor connected to a second track of the track assembly.

The electrical assembly according to any preceding embodiment, wherein the electrical characteristic of the identifier and electrical characteristics of each of the one or more additional identifiers are different.

The electrical assembly according to any preceding embodiment, wherein the track assembly includes a plurality of sections including a first section and one or more additional sections; the conductor and the additional conductor are connected to the first section; and the one or more pairs of other conductors and additional conductors are connected to respective sections of the one or more additional sections; the sensor is configured to sense electrical characteristics of the one or more additional identifiers; and the component includes a component controller configured to determine which section of the plurality of sections the component is connected to according to an output from the sensor.

The electrical assembly according to any preceding embodiment, wherein the component controller is configured to determine an orientation of the component according to an output from the sensor.

The electrical assembly according to any preceding embodiment, wherein the conductor, the additional conductor, and the one or more pairs of other conductors have respective resistivities; and the component controller is configured to determine a position of the component within the section according to the output of the sensor and one or more of the resistivities.

The electrical assembly according to any preceding embodiment, wherein the resistivities are equal.

The electrical assembly according to any preceding embodiment, wherein the component includes a first movable electrical contact that electrically connects the component with the first conductor, and a second movable contact that electrically connects the component with the second conductor.

The electrical assembly according to any preceding embodiment, wherein the electrical characteristic includes an impedance; and the impedance has a first value when the component is connected to the conductor and the additional conductor in a first direction, and a second value that is different from the first value when the component is connected to the conductor and the additional conductor in a second direction.

The electrical assembly according to any preceding embodiment, wherein the identifier includes a resistor and a diode connected in series.

The electrical assembly according to any preceding embodiment wherein, wherein the identifier includes a capacitor.

The electrical assembly according to any preceding embodiment, wherein the identifier includes a second resistor in parallel with the resistor and the diode.

The electrical assembly according to any preceding embodiment, wherein the identifier includes a Zener diode.

The electrical assembly according to any preceding embodiment, wherein the identifier includes an identifier controller and a variable resistor; and the identifier controller adjusts a resistance of the variable resistor according to a component electrical characteristic provided by the component to across the conductor and the additional conductor; and the electrical characteristic of the identifier includes the resistance.

The electrical assembly according to any preceding embodiment, wherein the component includes a component controller configured to control the component electrical characteristic provided by the component.

The electrical assembly according to any preceding embodiment, wherein the component includes a component controller configured to determine a position of the component relative to the track assembly according to the electrical characteristic and a resistivity of the first conductor.

The electrical assembly according to any preceding embodiment, wherein the conductor includes a first track of the track assembly; and the additional conductor includes a second track of the track assembly.

A method of operating the electrical assembly of any preceding embodiment, the method comprising connecting a component to a track assembly; sensing an electrical characteristic of an identifier of the component; determining a position of the component relative to the track assembly according to the electrical characteristic; and controlling one or more safety devices according to the determined position.

The method of any preceding embodiment, wherein the electrical characteristic includes at least one of a resistance, an impedance, a charge time, a discharge time, or a capacitance.

An electronic controller configured to operate any preceding embodiment.

An electronic controller configured to conduct the method of any preceding embodiment.

A non-transitory computer-readable storage medium having a computer program encoded thereon for implementing the method of any preceding embodiment.

In examples, a controller (e.g., a component controller 60$_M$, an identifier controller 150$x$) may include an electronic controller and/or include an electronic processor, such as a programmable microprocessor and/or microcontroller. In embodiments, a controller may include, for example, an application specific integrated circuit (ASIC) and/or an embedded controller. A controller may include a central processing unit (CPU), a memory (e.g., a non-transitory computer-readable storage medium), and/or an input/output (I/O) interface. A controller may be configured to perform various functions, including those described in greater detail herein, with appropriate programming instructions and/or code embodied in software, hardware, and/or other medium. In embodiments, a controller may include a plurality of controllers. In embodiments, a controller may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," "an embodiment," "with some configurations," "in some configurations," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," "an embodiment," "with some configurations," "in some configurations," or the like, in places throughout the specification are not necessarily all referring to the same embodiment. Furthermore, the particular features, structures, and/or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof. The word "exemplary" is used herein to mean "serving as a non-limiting example."

It should be understood that references to a single element are not necessarily so limited and may include one or more of such element, unless the context clearly indicates otherwise. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

"One or more" includes a function being performed by one element, a function being performed by more than one element, e.g., in a distributed fashion, several functions being performed by one element, several functions being performed by several elements, or any combination of the above. The term "at least one of" in the context of, e.g., "at least one of A, B, and C" or "at least one of A, B, or C" includes only A, only B, only C, or any combination or subset of A, B, and C, including any combination or subset of one or a plurality of A, one or a plurality of B, and one or a plurality of C.

Although the terms first, second, etc. are, in some instances, used herein to describe various elements, these elements should not be limited by these terms. These terms are only used to distinguish one element from another. For example, a first element could be termed a second element, and, similarly, a second element could be termed a first element, without departing from the scope of the various described embodiments. The first element and the second element are both elements, but they are not the same element.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. The term "and/or" as used herein refers to and encompasses any and all possible combinations of one or more of the associated listed items. Uses of "and" and "or" are to be construed broadly (e.g., to be treated as "and/or"). For example and without limitation, uses of "and" do not necessarily require all elements or features listed, and uses of "or" are inclusive unless such a construction would be illogical. The terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. Uses of "e.g." and "such as" in the specification are to be construed broadly and are used to provide non-limiting examples of embodiments of the disclosure, and the disclosure is not limited to such examples.

While processes, systems, and methods may be described herein in connection with one or more steps in a particular sequence, such methods may be practiced with the steps in a different order, with certain steps performed simultaneously, with additional steps, and/or with certain described steps omitted.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

All matter contained in the above description or shown in the accompanying drawings shall be interpreted as illustrative only and not limiting. Changes in detail or structure may be made without departing from the present disclosure.

A controller, an electronic control unit (ECU), a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

An article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. An electrical assembly, comprising:
- a track assembly of a vehicle;
- a first conductor connected to the track assembly;
- a second conductor connected to the track assembly;
- an identifier comprising a first terminal electrically connected to the first conductor and a second terminal electrically connected to the second conductor; and
- a component movably coupled with the track assembly, wherein the component comprises a sensor adapted to sense an electrical characteristic of the identifier, and wherein the identifier is a diode.

2. The electrical assembly of claim 1, wherein the first conductor is connected to a first track of the track assembly of the vehicle; and
- the second conductor is connected to a second track of the track assembly of the vehicle.

3. The electrical assembly of claim 2, wherein the first conductor and a third conductor are connected to the first track of the track assembly.

4. The electrical assembly of claim 3, wherein the identifier is a first identifier, and the electrical assembly further comprises a second identifier electrically connected to the third conductor and a fourth conductor.

5. The electrical assembly of claim 4, wherein the third conductor is connected to the first track of the track assembly and the fourth conductor is connected to the second track of the track assembly.

6. The electrical assembly of claim 4, wherein the electrical characteristic of the first identifier and electrical characteristics of the second identifier are different.

7. The electrical assembly of claim 6, wherein the track assembly comprises a first section and a second section;
- the first conductor and the second conductor are connected to the first section;
- the third conductor and the fourth conductor are connected to the second section;
- the sensor is adapted to sense the electrical characteristics of each of the first identifier and the second identifier; and
- the component comprises a component controller adapted to determine a section of the plurality of sections to which the component is connected based on an output of the sensor.

8. The electrical assembly of claim 7, wherein the component controller is adapted to determine an orientation of the component based on the output of the sensor.

9. The electrical assembly of claim 7, wherein the first conductor comprises a first resistivity, the second conductor comprises a second resistivity, the third conductor comprises a third resistivity, and the fourth conductor comprises a fourth resistivity; and the component controller is adapted to determine a position of the component within the first section or the second section based on the output of the sensor and at least one resistivity.

10. The electrical assembly of claim 1, wherein the component comprises a first movable electrical contact adapted to electrically connect the component with the first conductor, and a second movable contact adapted to electrically connect the component with the second conductor.

11. The electrical assembly of claim 1, wherein the electrical characteristic comprises an impedance; and wherein the impedance comprises a first value when the component is connected to the first conductor and the second conductor in a first direction, and wherein the impedance comprises a second value that is different from the first value when the component is connected to the first conductor and the second conductor in a second direction.

12. The electrical assembly of claim 11, wherein the identifier comprises a resistor connected in series with the diode.

13. The electrical assembly of claim 12, wherein the identifier comprises a second resistor in parallel with the resistor and the diode.

14. The electrical assembly of claim 1, wherein the diode is a Zener diode.

15. The electrical assembly of claim 1, wherein the identifier comprises an identifier controller and a variable resistor;

the identifier controller is adapted to adjust a resistance of the variable resistor based on a component electrical characteristic provided by the component across the first conductor and the second conductor; and the electrical characteristic of the identifier comprises an adjusted value of the resistance.

16. The electrical assembly of claim 15, wherein the component comprises a component controller adapted to control the component electrical characteristic provided by the component.

17. The electrical assembly of claim 1, wherein the component comprises a component controller adapted to determine a position of the component relative to the track assembly based on the electrical characteristic and a first resistivity of the first conductor.

18. The electrical assembly of claim 17, wherein the component controller is adapted to determine the position and an orientation of the component relative to the track assembly based on an output of the sensor.

19. The electrical assembly of claim 17, wherein the component controller is adapted to control movement of the component based on the position and the orientation of the component.

20. The electrical assembly of claim 18, wherein the component comprises one or more safety devices, and wherein the component controller is adapted to control actuation of the one or more safety devices based on the position and the orientation of the component.

* * * * *